(12) United States Patent
Van Zeijl

(10) Patent No.: US 6,590,459 B2
(45) Date of Patent: Jul. 8, 2003

(54) PHASE LOCK CIRCUIT

(75) Inventor: Paulus Thomas Maria Van Zeijl, Hengelo (NL)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/874,399

(22) Filed: Jun. 6, 2001

(65) Prior Publication Data

US 2002/0017958 A1 Feb. 14, 2002

(30) Foreign Application Priority Data

Jun. 6, 2000 (NL) .............................. 1015386

(51) Int. Cl.⁷ ................................................ H03L 7/00
(52) U.S. Cl. .................. 331/17; 331/36 C; 331/177 V; 327/156; 327/157
(58) Field of Search ................................. 331/17, 36 C, 331/177 V; 327/156, 157

(56) References Cited

U.S. PATENT DOCUMENTS

| | | | |
|---|---|---|---|
| 4,122,404 A | | 10/1978 | Fuhrman |
| 5,623,523 A | | 4/1997 | Gehrke |
| 5,831,484 A | * | 11/1998 | Lukes et al. .................. 331/17 |
| 6,157,242 A | * | 12/2000 | Fukui .......................... 327/536 |
| 6,222,421 B1 | * | 4/2001 | Kiyose ......................... 331/17 |
| 6,255,872 B1 | * | 7/2001 | Harada et al. ............... 327/157 |
| 6,388,506 B1 | * | 5/2002 | Voo ............................. 327/536 |

FOREIGN PATENT DOCUMENTS

| | | | |
|---|---|---|---|
| EP | 0 283 160 | 9/1988 | |
| EP | 0 369 858 | 5/1990 | |
| EP | 0 945 986 | 3/1999 | |
| GB | 2 278747 | 12/1994 | |
| JP | 11308856 A | * 11/1999 | ............ H02M/3/07 |
| WO | WO 99/21282 | 4/1999 | |

* cited by examiner

*Primary Examiner*—Michael Tokar
*Assistant Examiner*—Khai Nguyen
(74) *Attorney, Agent, or Firm*—Nixon & Vanderhye, PC

(57) ABSTRACT

A phase lock circuit comprising a phase frequency comparator having a first input for a reference signal and a second input for a feedback signal, as well as outputs for furnishing an up-signal or a down-signal to a control charge pump circuit, which control charge pump circuit is connected with the outputs of the phase frequency comparator and has an output which is connected via a loop filter with a voltage-controlled oscillator provided with tuning means, the output of the oscillator being connected via a frequency divider with the second input of the phase frequency comparator, while for furnishing a tuning voltage for the tuning means a voltage charge pump circuit is provided, which is combined with the control charge pump circuit to form a combined charge pump circuit connected with the output of the phase frequency comparator.

13 Claims, 4 Drawing Sheets

PHASE LOCK CIRCUIT

BACKGROUND

This invention relates to a phase lock circuit comprising a phase frequency comparator having a first input for a reference signal and a second input for a feedback signal, as well as outputs for furnishing an up-signal or a down-signal to a control charge pump circuit, which control charge pump circuit is connected with the outputs of the phase frequency comparator and has an output which is connected via a loop filter with a voltage-controlled oscillator provided with tuning means, the output of the oscillator being connected via a frequency divider with the second input of the phase frequency comparator.

Such a phase lock circuit is known from practice. A similar circuit is also described in EP-A-0 945 986.

A high-quality voltage-controlled oscillator with a low phase noise is tuned with the aid of a varactor. A problem occurring in the known phase lock circuits and in particular with integrated phase lock circuits is that in many applications the supply voltage is too low to realize the tuning voltage range needed for the varactor. In applications for, for instance, pagers, cordless phones, cellular phones, etc., often a 1.5 V battery is used, while for a varactor a tuning voltage range of, for instance, 0.5–3 V may be required.

Heretofore, this problem was solved by the use of a so-called step-up converter, which can generate a supply voltage which is higher than the battery voltage. A drawback of this solution, however, is that it requires a coil of high self-induction, which cannot be formed on a chip. This results in an increase of the number of required components and the manufacturing costs of the circuit, as well as of the space occupied and the chance of parasitic effects as a result of the necessary connections between the circuit section on the chip and the off-chip coil.

Instead of a step-up converter, a charge pump circuit could be used to generate a voltage higher than the battery voltage. An example of such a charge pump is described in IEEE JSSC Vol. 33 No. 4, April 1998. A problem inherent to that solution is that such a charge pump circuit must have a lower output impedance than the, already low, output impedance of the low-pass filter, which loads the output of the phase frequency comparator.

SUMMARY OF THE INVENTION

A need therefore exists for a phase lock circuit which on the one hand furnishes a sufficiently great tuning voltage range for the voltage-controlled oscillator but on the other hand does not require any components which cannot be made on a chip in integrated form, and whereby, moreover, problems with regard to internal impedance adjustment are avoided.

The object of the invention is to provide for the need outlined. To that end, according to the invention, a phase lock circuit of the above type is characterized in that for furnishing a tuning voltage for the tuning means a voltage charge pump circuit is provided, which is combined with the control charge pump circuit to form a single charge pump circuit connected with the output of the phase frequency comparator.

In the following, the invention will be further described with reference to the appended drawing.

DETAILED DESCRIPTION

Figure 1:
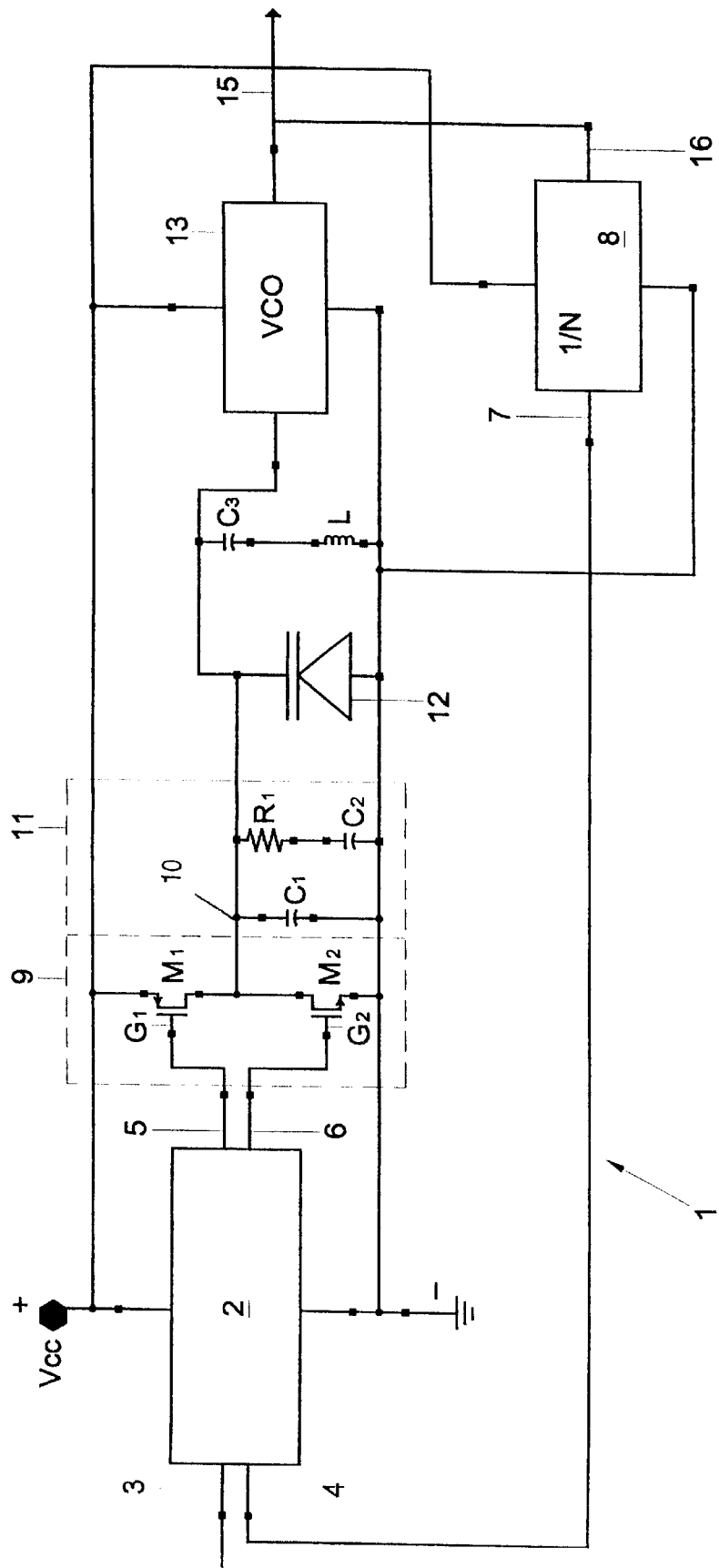
FIG. 1 schematically shows an example of a known phase lock circuit.

FIG. 1 schematically shows an example of a known phase lock circuit 1. The phase lock circuit 1 shown comprises a phase frequency comparator 2 with two inputs 3, 4 and two outputs 5, 6. The input 3 in operation receives a reference signal and the input 4 is connected with the output 7 of a feedback circuit 8, which comprises a frequency divider. The phase lock circuit is provided in a conventional manner with supply voltage Vcc, supplied by a battery (not shown), via supply terminals "+" and "−".

The phase frequency comparator compares the frequency of the two input signals and, depending on the result of that comparison, produces an up- or down-signal. The output signals of the phase frequency comparator are fed to the gates G1 and G2, respectively, of two MOS transistors M1 and M2, which are connected between the positive and the negative supply connections, and which jointly form a charge pump 9, which produces a control signal on an output 10. The output 10 is connected with a low-pass filter or loop filter 11 which, in the example shown, comprises a capacitor C1 parallel to a series connection of a capacitor C2 and a resistor R1. An up-signal (output 5) brings the transistor M1 into the conducting state, so that the RC network connected with output 10 of the charge pump is charged with a constant current, whereas a down-signal (output 6) brings transistor M2 into the conducting state, so that the RC network connected with the output 10 is discharged with a constant current.

The output 10 is further connected via the loop filter 11 with a varactor 12, which constitutes a part of a voltage-controlled oscillator (VCO) 13, and so do a coil L and a capacitor C3.

In the circuit described so far, the output 10 of the charge pump 9 cannot furnish a higher voltage than the supply voltage Vcc. The control voltage for the varactor, and hence the tuning voltage range for the VCO 13, is therefore limited by the battery voltage.

Often, however, there is a need for a greater tuning voltage range. To that end, in the state of the art, often a so-called step-up converter (not shown) is used as a voltage boost circuit between the battery and the supply voltage terminals of the charge pump.

The output 15 of the VCO furnishes the desired phase-locked output signal and is further connected with the input 16 of the frequency divider 8 already mentioned.

A drawback of a step-up converter is that the coil of high self-induction of the voltage boost circuit cannot be integrated on a chip and moreover is relatively sizable. The coil therefore constitutes an off-chip component, for which separate connections are needed, and which takes up extra space.

Figure 2:
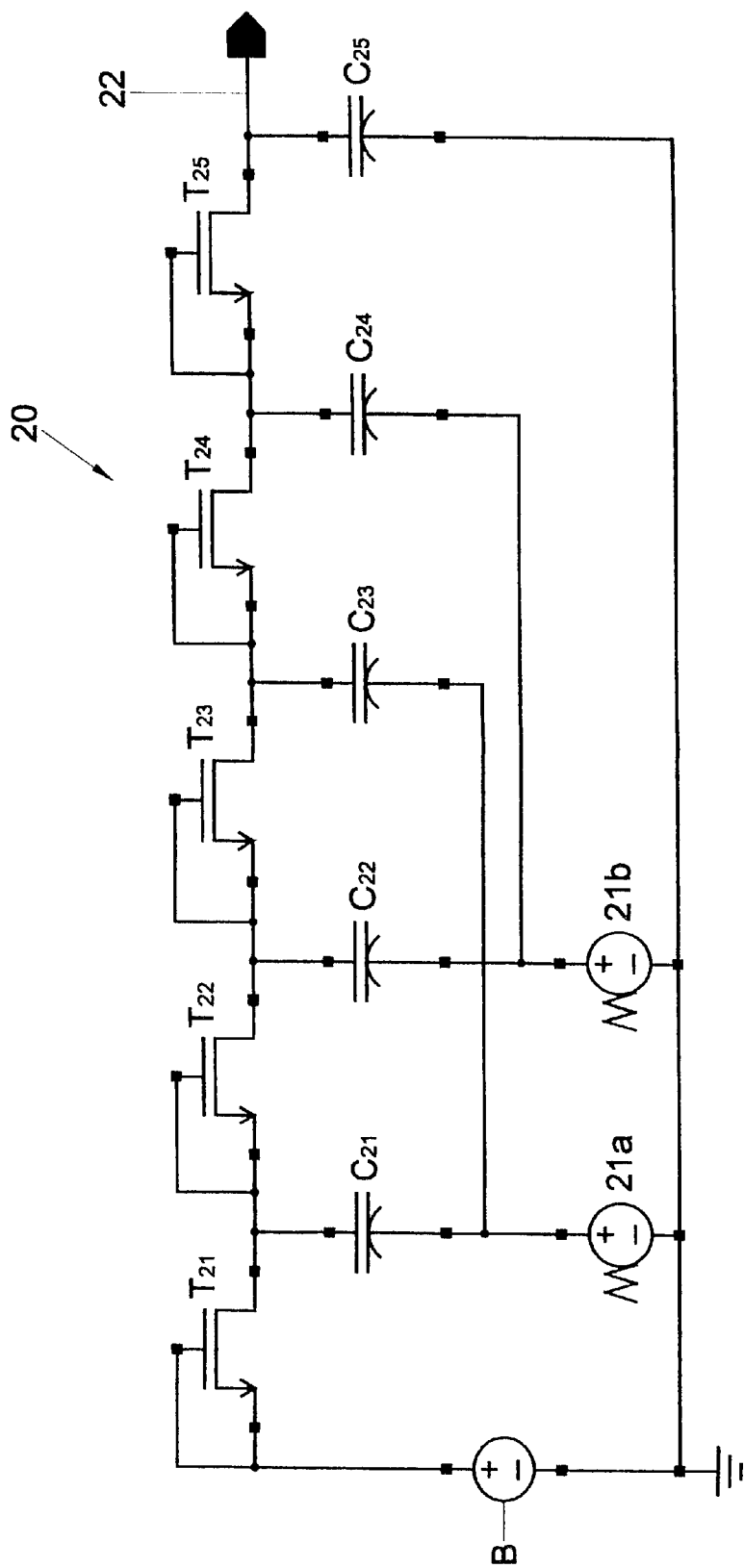
FIG. 2 schematically shows an example of a voltage boost charge pump circuit.

FIG. 2 schematically shows an example of a different type of voltage boost circuit 20, which is designed as a voltage charge pump, known per se. The aim of the invention is the use of such a voltage charge pump in a phase lock circuit. The voltage charge pump shown can be produced wholly in integrated form and can moreover furnish an output voltage which is higher than the voltage of the supply battery B.

The voltage charge pump actually comprises a capacitor network switched by means of semiconductor switching elements, for instance MOS transistors T21 to T25, which network, in the example shown, comprises capacitors C21 to C25. Switching is done with the aid of clock signals furnished by clock circuits 21*a* and 21*b* which are respectively connected with the capacitors C21, C23 and C22, C24, respectively. Capacitor C25 is connected between the output 22 of the voltage charge pump and earth. The clock signals are usually the same signals, which, however, are in antiphase.

Figure 3:
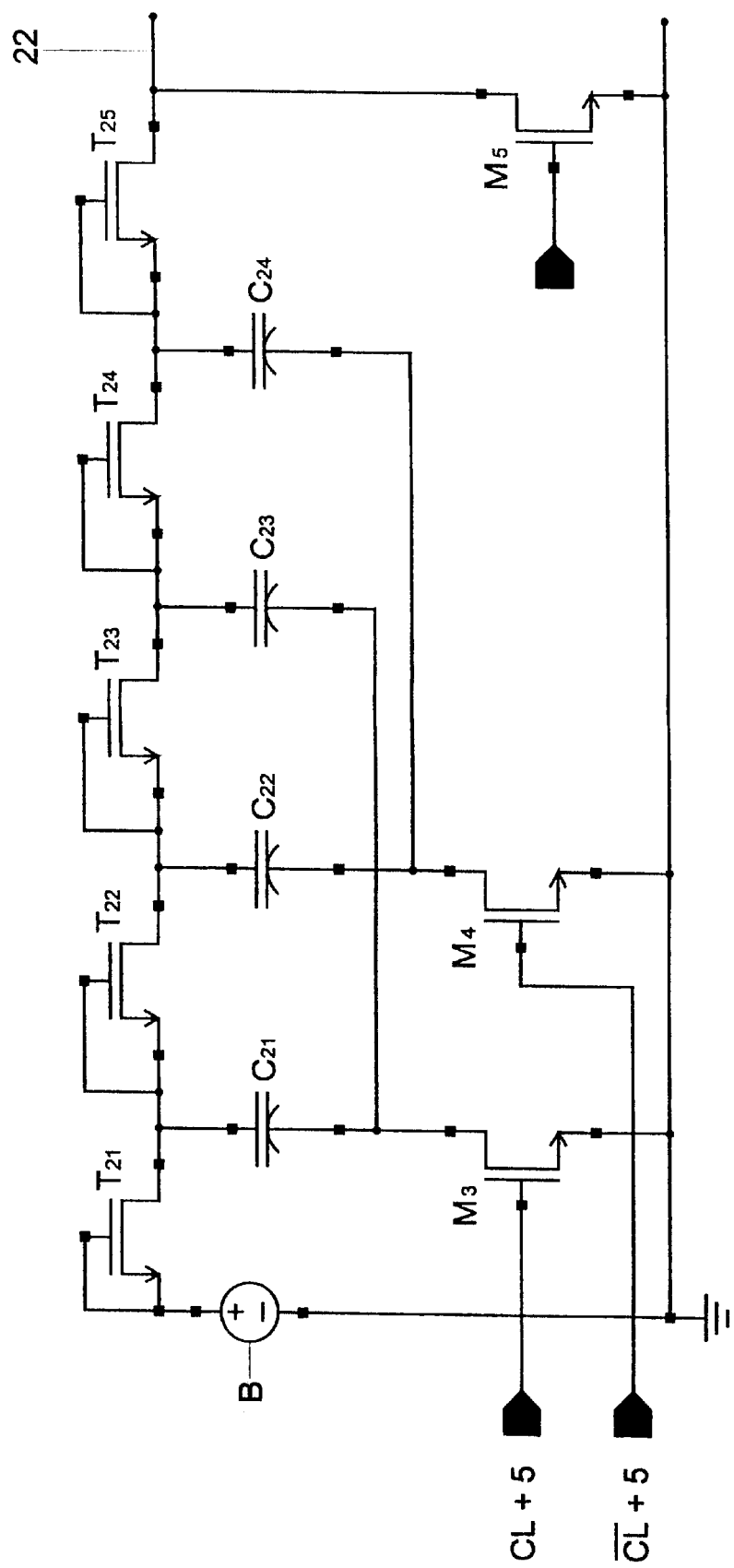
FIG. 3 schematically shows an example of a combined charge pump circuit for use in a phase lock circuit according to the invention.

FIG. 3 schematically shows an example of a voltage charge pump 20 of the type shown in FIG. 2, combined with the control charge pump 9 of the circuit of FIG. 1. The transistors (or arrays of transistors) M3 and M4 are controlled by the clock signals CL and $\overline{CL}$ together with the up-signal of output 5 of FIG. 1, with the understanding that the clock signals (and hence the voltage boost effect) only occur if an up-signal is present. The transistors M3 and M4 are comparable to transistor M1 of FIG. 1. The down-signal is applied directly to the transistor (or the array of transistors) M5. The down-signal brings the transistor M5 into the conducting state, so that a current is drawn from the output 22. Transistor M5 is comparable to transistor M2 of FIG. 1.

The function of the last capacitor C25 shown in FIG. 2 can be taken over by the capacitor(s) of the loop filter.

Figure 4:
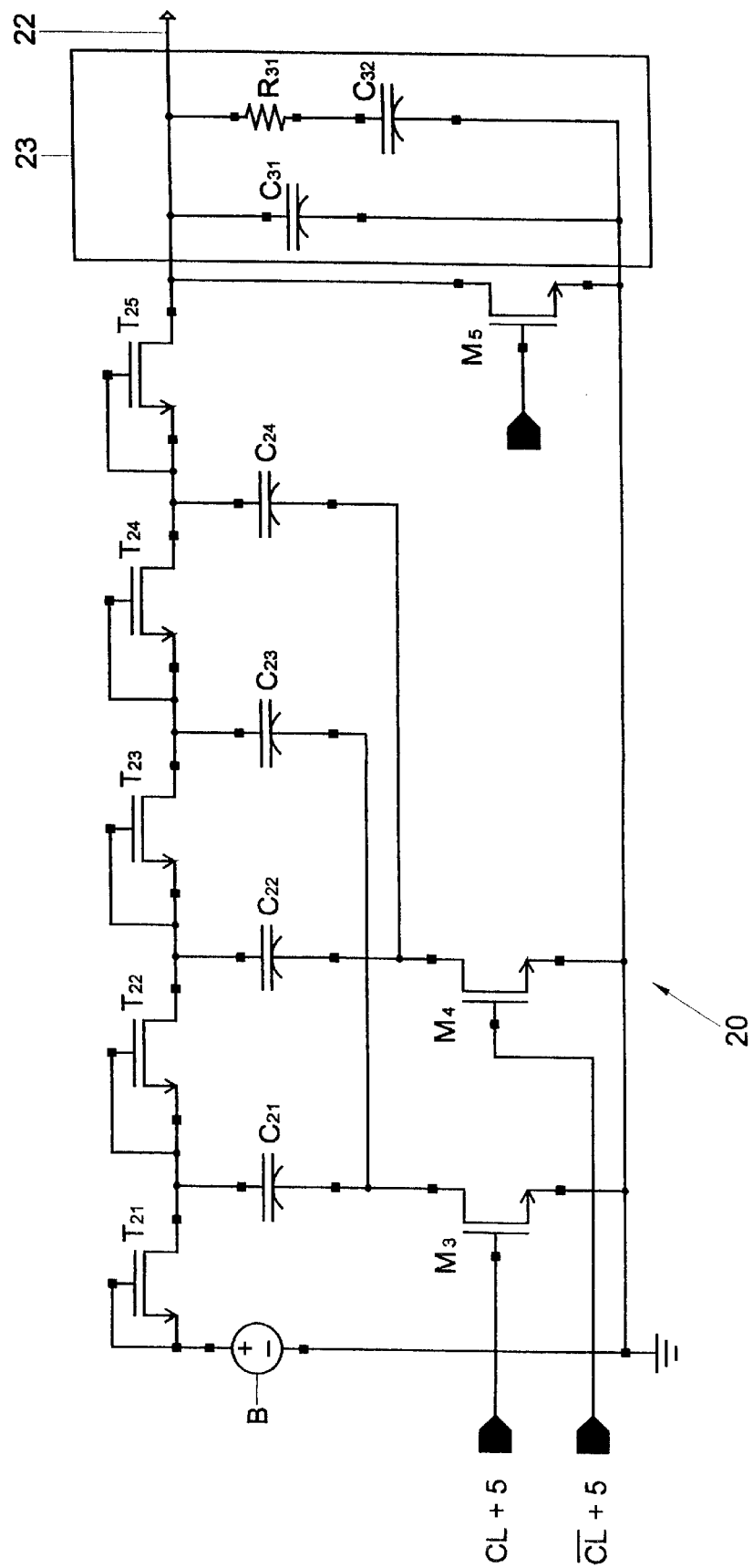
FIG. 4 schematically shows a combination of the circuit of FIG. 3 with a low-pass filter for use in a phase lock circuit according to the invention.

FIG. 4 schematically shows the voltage charge pump circuit 20 of FIG. 3 combined with a loop filter 23, which is comparable to the loop filter 11, though optionally with adjusted capacitance values of the capacitors C31, C32.

The clock frequency can give rise to an interfering frequency at the output of the VCO 13. The clock frequency must therefore be preferably filtered out with the aid of a suitable RC filter Filtering out the clock frequency is simplified if a relatively high clock frequency is used. This has as an additional advantage that dimensions of the capacitors can be small and that the operation of the voltage charge pump circuit becomes more efficient. Between the charge pump circuit and the varactor, additionally a small high-frequency low-pass filter can be connected.

After the foregoing, various modifications will readily occur to those skilled in the art. Thus, the invention also applies if a voltage-controlled oscillator is used that does not require a separate varactor For instance, use can be made of a junction capacitance inherently present in a transistor, or a MOS gate capacitance, or of other tuning means. Further, instead of a phase frequency comparator with three output states (up, off, down), also a phase frequency comparator with more states, for instance five states (high up, up, off, down, low down), can be used. Such modifications are understood to fall within the scope of the appended claims.

What is claimed is:

1. A phase lock circuit comprising a phase frequency comparator having a first input for a reference signal and a second input for a feedback signal, as well as outputs for furnishing an up-signal or a down-signal to a control charge pump circuit, which control charge pump circuit is connected with the outputs of the phase frequency comparator and has an output which is connected via a loop filter with a voltage-controlled oscillator provided with tuning means, the output of the oscillator being connected via a frequency divider with said second input of the phase frequency comparator, characterized in that for furnishing a tuning voltage for the tuning means a voltage charge pump circuit is provided, which is combined with the control charge pump circuit to form a combined charge pump circuit connected with the output of the phase frequency comparator, and further characterized in that the combined charge pump circuit comprises two transistor elements each operatively controlled by a clock signal in combination with the up-signal, which transistor elements are alternately connected with successive capacitors of the charge pump circuit, and a third transistor element is provided which is connected between the output of the charge pump circuit and earth and which is operatively controlled by the down-signal.

2. A phase lock circuit according to claim 1, characterized in that the charge pump circuit and the loop filter are dimensioned such that at least one capacitor of the loop filter at the same time functions as part of the charge pump circuit.

3. A phase lock circuit according to claim 2, characterized in that the values of the capacitors of the charge pump circuit are chosen such that these capacitors, together with a high-frequency low-pass filter connected with the output of the charge pump circuit, function as filter for filtering out signals with the clock frequency.

4. A phase lock circuit according to claim 1, characterized in that the tuning means comprises a varactor.

5. A phase lock circuit according to claim 1, characterized in that the tuning means comprises a capacitance inherently present in a transistor.

6. A phase lock circuit according to claim 1, characterized in that the phase frequency comparator has at least two outputs for furnishing up-signals of different strengths and at least two outputs for furnishing down-signals at different strengths.

7. A phase lock circuit comprising:
   a phase frequency comparator having a first input for a reference signal and a second input for a feedback signal and one or more outputs for furnishing an up-signal or a down-signal;
   a charge pump circuit including:
      a charge pump controller connected to the one or more outputs of the phase frequency comparator and to a voltage charge pump including plural capacitors;
      first and second transistors coupled to one or more of the plural capacitors and operatively controlled by a clock signal in combination with the up-signal; and
      a third transistor connected to an output of the charge pump circuit and operatively controlled by the down-signal; and
   a voltage-controlled oscillator connected to an output of the phase frequency comparator and having a tuner, an output of the voltage-controlled oscillator connected to the second input of the phase frequency comparator.

8. A phase lock circuit according to claim 7, further comprising:
   a loop filter coupled to the output of the charge pump circuit,
   wherein a capacitor in the loop filter functions as part of the charge pump circuit.

9. A phase lock circuit according to claim 8, further comprising:
   a high frequency, low pass filter connected to the output of the charge pump circuit for filtering signals at a frequency of the clock signal.

10. A phase lock circuit according to claim 7, wherein the tuner includes a varactor.

11. If A phase lock circuit according to claim 7, wherein the tuner includes a capacitance present in a transistor.

12. A phase lock circuit according to claim 7, wherein the phase frequency comparator includes at least two outputs for furnishing up-signals of different strengths and at least two outputs for furnishing down-signals of different strengths.

13. A phase lock circuit according to claim 7, further comprising:
   a frequency divider coupled between the output of the voltage-controlled oscillator and the second input of the phase frequency comparator.

\* \* \* \* \*